(12) United States Patent
Pillarisetty et al.

(10) Patent No.: US 9,564,490 B2
(45) Date of Patent: *Feb. 7, 2017

(54) APPARATUS AND METHODS FOR FORMING A MODULATION DOPED NON-PLANAR TRANSISTOR

(71) Applicant: Intel Corporation, Santa Clara, CA (US)

(72) Inventors: Ravi Pillarisetty, Portland, OR (US); Mantu Hudait, Blacksburg, VA (US); Marko Radosavljevic, Portland, OR (US); Willy Rachmady, Beaverton, OR (US); Gilbert Dewey, Hillsboro, OR (US); Jack Kavalieros, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/985,282

(22) Filed: Dec. 30, 2015

(65) Prior Publication Data

US 2016/0118464 A1 Apr. 28, 2016

Related U.S. Application Data

(60) Continuation of application No. 14/104,096, filed on Dec. 12, 2013, now Pat. No. 9,257,346, which is a division of application No. 13/032,777, filed on Feb. 23, 2011, now Pat. No. 8,633,471, which is a division (Continued)

(51) Int. Cl.
| | |
|---|---|
| H01L 29/772 | (2006.01) |
| H01L 29/12 | (2006.01) |
| H01L 29/15 | (2006.01) |
| H01L 29/66 | (2006.01) |
| H01L 21/8238 | (2006.01) |
| H01L 29/06 | (2006.01) |
| H01L 29/205 | (2006.01) |
| H01L 29/207 | (2006.01) |

(52) U.S. Cl.
CPC ..... *H01L 29/155* (2013.01); *H01L 21/823807* (2013.01); *H01L 21/823892* (2013.01); *H01L 29/0653* (2013.01); *H01L 29/205* (2013.01); *H01L 29/207* (2013.01); *H01L 29/66431* (2013.01); *H01L 29/66462* (2013.01); *H01L 29/66795* (2013.01)

(58) Field of Classification Search
CPC ............. H01L 29/66431; H01L 29/66462; H01L 29/66446; H01L 29/66522; H01L 29/66795; H01L 29/785; H01L 29/7784
See application file for complete search history.

(56) References Cited

U.S. PATENT DOCUMENTS

| | | |
|---|---|---|
| 5,322,808 A | 6/1994 | Brown et al. |
| 5,701,019 A | 12/1997 | Matsumoto et al. |
| 8,633,471 B2 | 1/2014 | Pillarisetty et al. |

(Continued)

*Primary Examiner* — Matthew Landau
*Assistant Examiner* — Scott Stowe
(74) *Attorney, Agent, or Firm* — Winkle, PLLC

(57) ABSTRACT

Embodiments of an apparatus and methods for providing three-dimensional complementary metal oxide semiconductor devices comprising modulation doped transistors are generally described herein. Other embodiments may be described and claimed, which may include forming a modulation doped heterostructure, comprising forming an active portion having a first bandgap and forming a delta doped portion having a second bandgap.

18 Claims, 3 Drawing Sheets

Related U.S. Application Data of application No. 12/319,097, filed on Dec. 30, 2008, now Pat. No. 7,915,642.

(56) References Cited

U.S. PATENT DOCUMENTS

| | | |
|---|---|---|
| 2008/0237577 A1 | 10/2008 | Chui et al. |
| 2008/0237636 A1 | 10/2008 | Jin et al. |

…

APPARATUS AND METHODS FOR FORMING A MODULATION DOPED NON-PLANAR TRANSISTOR

RELATED APPLICATION

The present application is a continuation of U.S. patent application Ser. No. 14/104,096, filed on Dec. 12, 2013, entitled "APPARATUS AND METHODS FOR FORMING A MODULATION DOPED NON-PLANAR TRANSISTOR", which is a divisional of U.S. patent application Ser. No. 13/032,777, filed on Feb. 23, 2011, now patented as U.S. Pat. No. 8,633,471, issued on Jan. 21, 2014, entitled "APPARATUS AND METHODS FOR FORMING A MODULATION DOPED NON-PLANAR TRANSISTOR", which is a divisional of U.S. patent application Ser. No. 12/319,097, filed on Dec. 30, 2008, now patented as U.S. Pat. No. 7,915,642, issued on Mar. 29, 2011 entitled "APPARATUS AND METHODS FOR FORMING A MODULATION DOPED NON-PLANAR TRANSISTOR".

FIELD OF THE INVENTION

The field of invention relates generally to the field of semiconductor integrated circuit manufacturing and, more specifically but not exclusively, relates to three-dimensional complementary metal oxide semiconductor (CMOS) devices comprising modulation doped transistors.

BACKGROUND INFORMATION

A variety of electronic and optoelectronic devices can be enabled by developing thin film relaxed lattice constant III-V semiconductors on elemental silicon (Si) substrates. Surface layers capable of achieving the performance advantages of III-V materials may host a variety of high performance electronic devices such as complementary metal oxide semiconductor (CMOS) and modulation doped quantum well (QW) transistors fabricated from extreme high mobility materials such as, but not limited to, indium antimonide (InSb), indium gallium arsenide (InGaAs) and indium arsenide (InAs). Modulation doping is provided by doping a wide band gap semiconductor layer grown adjacent to a narrow gap semiconductor, forming a heterostructure. High mobility, modulation doped quantum well devices require the formation of several perpendicular epitaxially grown layers, making them incompatible with previous non-planar transistor fabrication techniques.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein like reference numerals refer to like parts throughout the various views unless otherwise specified.

DETAILED DESCRIPTION

Figure 1:
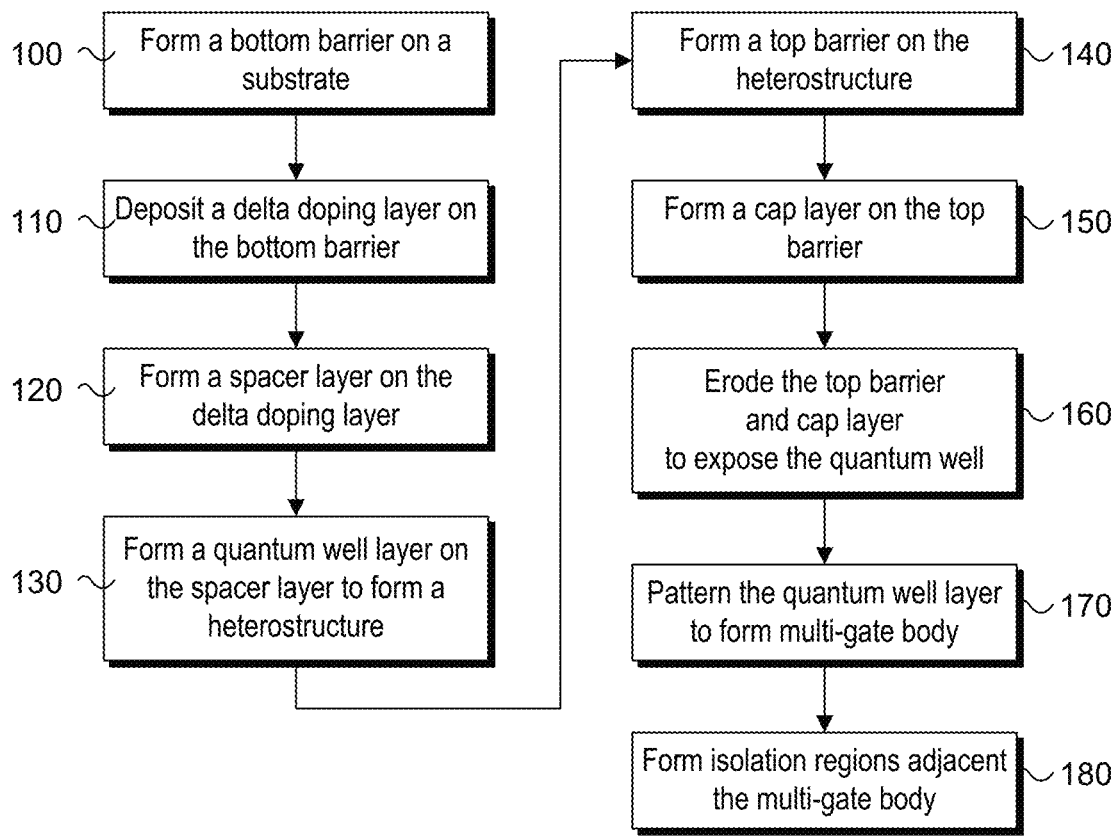
FIG. 1 is a flowchart describing one embodiment of a fabrication process used to form a modulation doped non-planar transistor.

In various embodiments, an apparatus and methods for forming modulation doped non-planar transistors are described. In the following description, various embodiments will be described. However, one skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

Performance of multi-gate MOS transistors can be improved through implementation of epitaxially grown heterostructures consisting of at least two materials with different bandgaps, including III-V, II-VI, or group IV systems, wherein the heterostructure comprises a large bandgap material and a narrow bandgap material. A III-V system is a chemical compound consisting of elements with at least one group III element and at least one group V element. A II-VI system is a chemical compound consisting of elements with at least one group II element and at least one group VI element. Further, a group IV system consists of one or more elements from group IV. The heterostructure is delta doped in the large bandgap material, providing a modulation doped structure comprising the delta doped large bandgap material adjacent to the narrow bandgap material.

The heterostructure is employed in a non-planar structure by patterning and etching the smaller or narrow bandgap material to form a plurality of fins and/or semiconductor bodies with substantially equal length sides. The modulation doped narrow bandgap material, shaped into semiconductor bodies, form an active portion of the transistor. The active portion of the device, substantially void of dopants, can provide a significant enhancement to carrier mobility due at least in part to improved Coloumb scattering over conventional non-planar devices containing high levels of doping in the active portion of the device.

It would be an advance in the art of semiconductor device manufacturing to fabricate modulation doped non-planar transistors using a process flow compatible with conventional silicon-based non-planar device manufacturing capabilities. Use of a modulation doped non-planar transistor can offer gate length (Lg) and threshold voltage (Vt) scalability as compared to conventional modulation doped planar quantum well devices formed in semiconductor heterostructures.

Embodiments for forming a modulation doped non-planar transistor are described in FIG. 1 in reference to illustrations described in FIGS. 2 through 6. Now turning to the figures, FIG. 1 is a flowchart describing an embodiment of a fabrication process used to form a modulation doped non-planar transistor. In element 100, a bottom barrier is formed on a substrate. The bottom barrier corresponds to bottom barrier layer 220 of a capped modulation doped heterostructure 200 of FIG. 2.

The bottom barrier layer 220, as well as other layers in the capped modulation doped heterostructure 200, is formed on a substrate 210 using chemical vapor deposition (CVD), molecular beam epitaxy (MBE), metalorganic chemical vapor deposition (MOCVD), or ultra high vacuum chemical vapor deposition (UHCVD) methods. Substrate 210 may comprise a bulk silicon or silicon-on-insulator substructure. Alternatively, substrate 210 may comprise other materials—which may or may not be combined with silicon—such as: germanium, indium antimonide, lead telluride, indium arsenide, indium phosphide, gallium arsenide, or gallium antimonide. Although a few examples of materials from which substrate 210 may be formed are described here, any material that may serve as a foundation upon which a semiconductor device may be built falls within the spirit and scope of the present invention.

In this embodiment, the bottom barrier layer 220 is formed from a large bandgap material such as an Indium-Aluminum-Arsenide (InAlAs) compound grown epitaxially to a thickness ranging between 10 nm to 50 nanometers (nm) or more preferably between 10 nm to 30 nm. In another embodiment, the bottom barrier layer 220 is epitaxially formed from Aluminum-Gallium-Arsenide (AlGaAs), Aluminum-Indium-Antimony (AlInSb), or Silicon-Germanium (SiGe).

Figure 2:
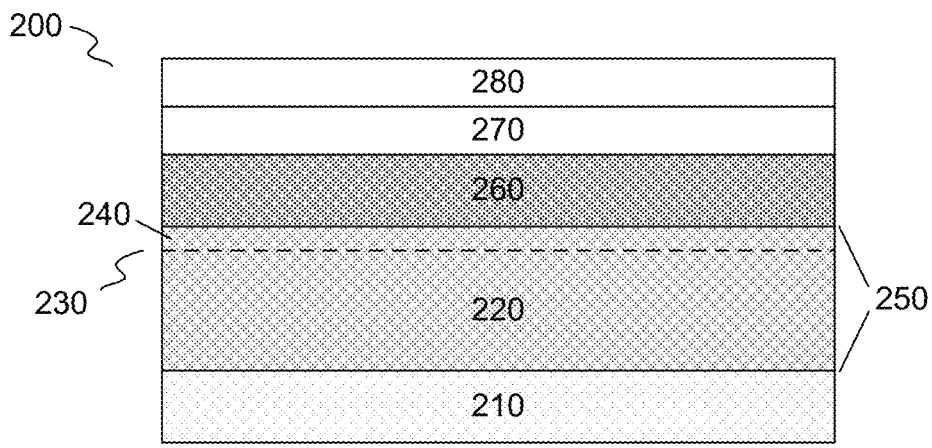
FIG. 2 is a cross-sectional view of a modulation doped layer stack on a substrate.

In element 110 of FIG. 1 and illustrated in FIG. 2, a delta doping layer 230 is formed on the bottom barrier layer 220. Formation of the delta doping layer 230 may be performed by suspending the epitaxial formation of bottom barrier layer 220 and exposing a surface of the bottom barrier layer to a flux of elemental doping atoms or to a flux of a doping precursor. Formation of the delta doping layer 230 provides a well-defined and narrow dopant layer to provide a doping distribution that has a high peak concentration and a narrow distribution width as narrow as a single atomic layer. A thickness of the delta doping layer 230 may range between 5 angstroms (Å) to 30 nm and more preferably between 5 Å to 2 nm. Materials used to form the delta doping layer 230 may be silicon (Si), beryllium (Be), tellurium (Te), and/or carbon (C) for III-V systems. Alternately, for SiGe or Ge systems, materials used to form the delta doping layer 230 may be boron (B), phosphorus (P), arsenic (As), and/or antimony (Sb).

Following formation of the delta doping layer 230, a spacer layer 240 is formed in element 120 of FIG. 1. The spacer layer 240 may comprise the same material used to form the bottom barrier layer 220, though the embodiment is not so limited. The spacer layer 240 may be formed by terminating the dopant source used to form the delta doping layer 230 and resuming the epitaxial growth used to form the bottom barrier layer 220. Formation of the spacer layer 240 in this manner substantially confines the doping atoms to the region of the delta doping layer 230. The stack of layers illustrated in FIG. 2 including the bottom barrier layer 220, delta doping layer 230 and the spacer layer 240 is a delta doped large bandgap stack 250, or delta doped portion of a delta doped heterostructure 400 of FIG. 4.

In element 130 of FIG. 1, a quantum well layer comprising narrow bandgap material corresponding to a narrow bandgap layer 260 of FIG. 2 is formed on the spacer layer 240 to provide a delta doped modulation doped layer stack, with a narrow bandgap material formed adjacent to a large bandgap material. The narrow bandgap layer 260 is formed of Indium-Gallium-Arsenide (InGaAs) in this embodiment, though the embodiment is not so limited. The narrow bandgap layer 260 may alternately be formed of InSb, GaAs, and/or Ge. A thickness of the narrow bandgap layer 260 ranges between 5 nm to 100 nm or more preferably between 20 nm to 40 nm.

In element 140 of FIG. 1, a top barrier layer 270 is formed on the narrow bandgap layer 260. The top barrier layer 270 of FIG. 2 is formed of an Indium-Phosphorus compound (InP) using an epitaxial process in one embodiment. However, the top barrier layer 270 may also be formed of a material with a large bandgap, such as InAlAs, AlGaAs, AlInSb, and SiGe. A thickness of the top barrier layer 270 is selectively designed to provide desired barrier characteristics and may range between 10 nm to 60 nm or more preferably between 15 nm to 30 nm in one embodiment.

In element 150 of FIG. 1, a cap layer 280 is formed on the top barrier layer 270. The cap layer 280 of FIG. 2 is formed of a doped InGaAs compound to protect the underlying layers and/or structures. In this embodiment, the InGaAs compound is doped with an n-type dopant such as phosphorus (P), arsenic (As), antimony (Sb), or nitrogen (N) to passivated surface states, at concentrations up to or about $1E19$ atoms/cm$^3$. The dopant type used for the cap layer 280 depends on the dopant type used for the delta doping layer 230. For example, in an embodiment where InGaAs is used for the narrow bandgap layer 260, an n-type channel is formed so an n-type doped cap layer 280 would also be used. A thickness of the cap layer 280 is selectively designed to protect underlying layers and/or structures and may range between 1 nm to 10 nm or more preferably between 2 nm to 4 nm.

In another embodiment, formation of the top barrier layer 270 and the cap layer 280 may optionally be applied to the narrow bandgap layer 260. However, application of the top barrier layer 270 and cap layer 280 may provide for a higher quality narrow bandgap layer 260 as the application of the cap layer 280 may help to passivated surface states. The top barrier layer 270 and the cap layer 280 may be formed using conventional epitaxial growth techniques.

Figure 3:
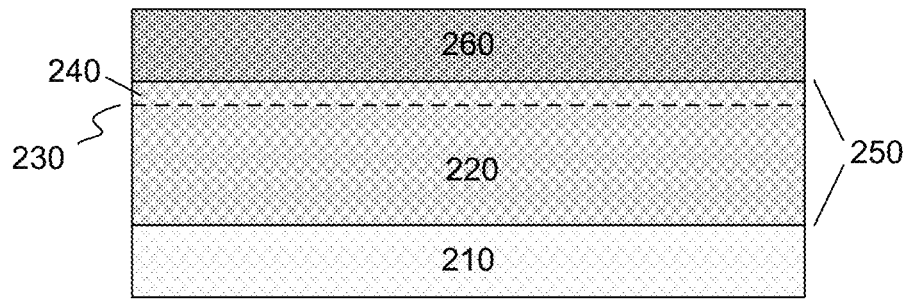
FIG. 3 is an illustration of the device of FIG. 2 after eroding a cap and a top barrier layer.

The cap layer 280 and the top barrier layer 270 is eroded in element 160 of FIG. 1 to expose the narrow bandgap layer 260. FIG. 3 is an illustration of the capped modulation doped heterostructure 200 of FIG. 2 after eroding the cap layer 280 and the top barrier layer 270. The narrow bandgap layer 260 is exposed by etching the cap layer 280 and top barrier layer 270 using dry etch and/or wet etch techniques known to one skilled in the art. The particular dry etch and/or wet etch sequence provided is selective to etching of the cap layer 280 and the top barrier layer 270 without significantly disturbing the narrow bandgap layer 260.

The quantum well layer or narrow bandgap layer 260 and a portion of the delta doped large bandgap stack 250 is patterned to form a multi-gate body in element 170 of FIG. 1. The narrow bandgap layer 260 may be patterned using photolithography and etch techniques to create a tri-gate device structure with three gates of substantially the same length. In an alternate embodiment, the narrow bandgap layer 260 is pattered to create a narrow finFET structure with two gates of substantially the same length. The portion of the delta doped large bandgap stack 250 is also patterned to form recessed regions. In element 180, isolation regions are formed adjacent to the multi-gate body formed in element 170 of FIG. 1. Embodiments of the device formed from element 180 are illustrated in FIG. 4 and a corresponding isometric view illustrated in FIG. 5.

Figure 4:
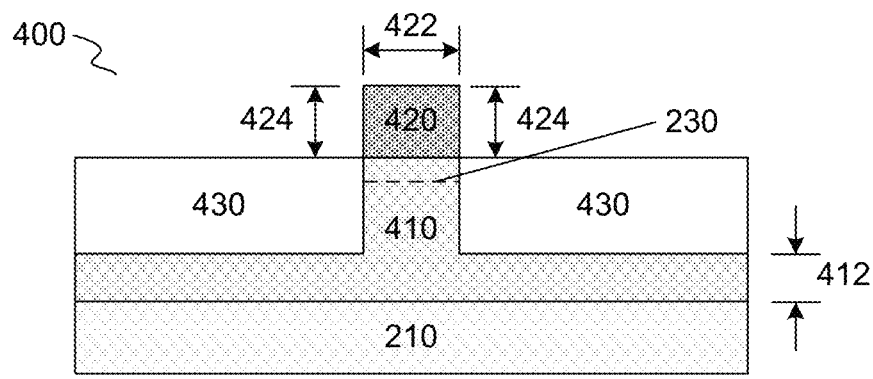
FIG. 4 is an illustration of the device of FIG. 3 after patterning the modulation doped layer stack to form a delta doped heterostructure and forming isolation regions adjacent to the heterostructure.

FIG. 4 is an illustration of the device of FIG. 3 after patterning the modulation doped layer stack to form a delta doped heterostructure 400 and forming isolation regions 430. In this embodiment, portions of the bottom barrier layer 220, the delta doping layer 230, and the spacer layer 240 are eroded to form a large bandgap structure 410 and to provide recesses for the formation of isolation regions 430 adjacent to the large bandgap structure 410. The large bandgap structure 410, may be formed by patterning the delta doped large bandgap stack 250 during the formation of a multi-gate body 420, which serves as an active region for a modulation doped non-planar transistor.

The large bandgap structure 410 is patterned to provide a large bandgap base thickness 412 wherein the large bandgap base thickness 412 may be nearly equal to the entire thickness of the large bandgap structure. Alternately, the large bandgap base thickness 412 may be zero, such that the isolation regions 430 are directly adjacent to the underlying substrate 210. The isolation regions 430 may be formed of a dielectric material such as a silicon oxide, silicon nitride, silicon oxynitride, or a high-k dielectric material. Some of the materials that may be used to form isolation regions 430 include: hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. The isolation regions 430 may be formed using a conventional deposition method, e.g., a conventional chemical vapor deposition ("CVD"), low pressure CVD, or physical vapor deposition ("PVD") process. Preferably, a conventional atomic layer CVD process is used.

Figure 5:
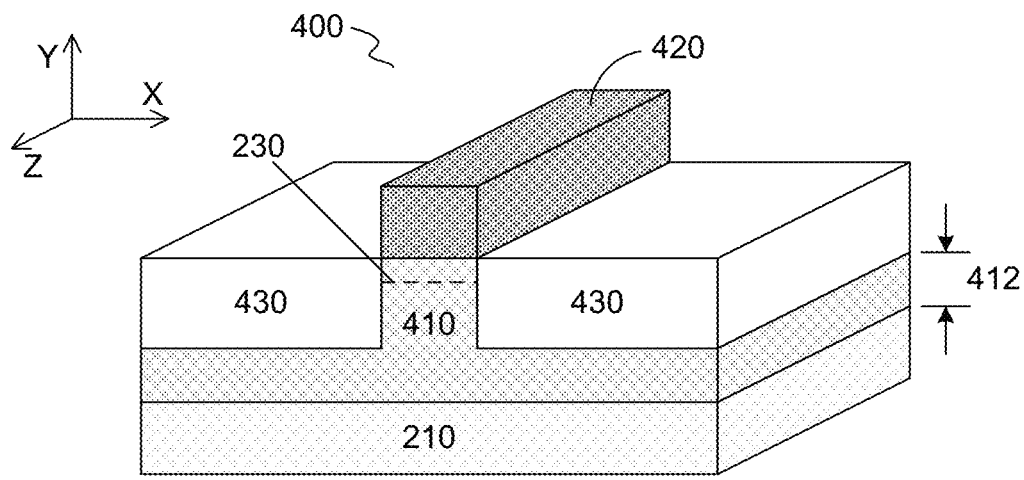
FIG. 5 is an isometric view of the delta doped heterostructure of FIG. 4.

The multi-gate body 420 formed from the narrow bandgap layer 260 is patterned with a top gate length 422 and side gate lengths 424. The top gate length 422 is substantially equal to the side gate lengths 424 in this embodiment. In an alternate embodiment (not shown), the multi-gate body is a finFET structure with two substantially equal length gates. FIG. 5 is an isometric view of the delta doped heterostructure 400 of FIG. 4 shown to indicate that the heterostructure extends along a Z-axis of a cartesian coordinate system.

Figure 6:
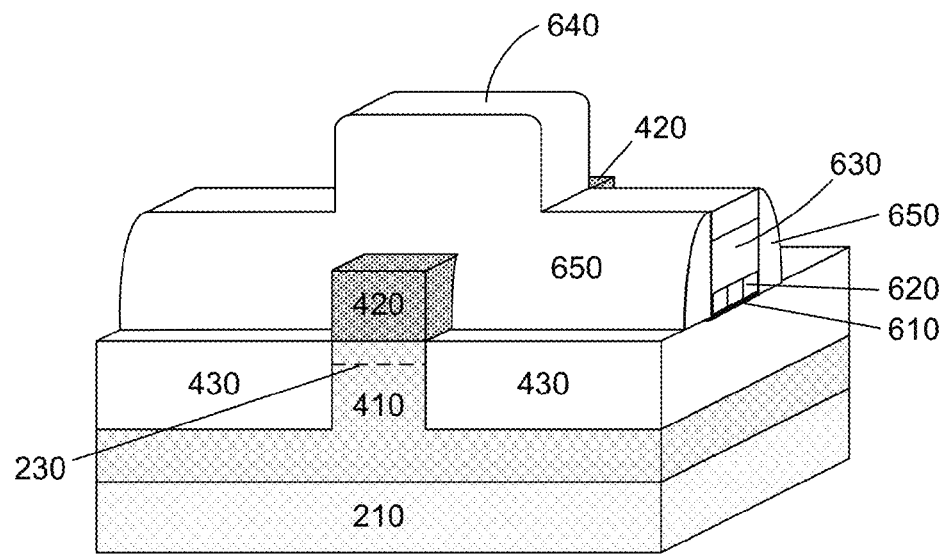
FIG. 6 is an isometric view of the device of FIG. 5 after forming a gate electrode and gate isolation spacers on the gate electrode.

FIG. 6 is an isometric view of the device of FIG. 5 after forming a gate electrode and gate isolation spacers on the gate electrode to form an embodiment of a modulation doped non-planar transistor. A multi-gate dielectric layer 610 is formed on the delta doped heterostructure 400 of FIG. 4, the multi-gate dielectric layer 610 comprising at least one of silicon oxide or a high-K material. The high-K material comprises at least one of lanthanum oxide, tantalum oxide, titanium oxide, hafnium oxide, zirconium oxide, lead-zirconate-titanate, barium-strontium-titanate, or aluminum oxide. The multi-gate dielectric layer 610 is deposited as a conformal layer on the multi-gate body 420 using methods known to persons having ordinary skill in the art, such as plasma enhanced chemical vapor deposition (PECVD), high density chemical vapor deposition (HDCVD), molecular organic chemical vapor deposition (MOCVD), Atomic Layer Deposition (ALD), or sputtering.

A conformal workfunction metal layer 620 is fabricated at a desired thickness on the multi-gate dielectric layer 610. A workfunction metal is a metal with a known work function, which is an inherent characteristic of the metal expressed in units of electron volts (eV). In one embodiment, the workfunction metal layer 620 comprises at least one of titanium nitride, tantalum nitride, or another transition nitride metal. A workfunction metal layer thickness is a function of the targeted threshold voltage ($V_t$) for the multi-gate device. In one embodiment, the workfunction metal layer is formed using a directional sensitive physical vapor deposition (PVD) process.

A multi-gate electrode 630, such as polysilicon, and a hard mask 640 is fabricated on the workfunction metal layer 620. The multi-gate electrode 630 and the hard mask 640 are formed by a series of deposition, lithography, and etch processes known to one ordinarily skilled in the art. The multi-gate electrode 630 may be doped or un-doped and the hard mask 640 may comprise silicon nitride or silicon oxynitride. Gate isolation spacers 650 are formed to protect the multi-gate electrode 630, the workfunction metal layer 620, and the multi-gate dielectric layer 610 during subsequent processing.

Figure 7:
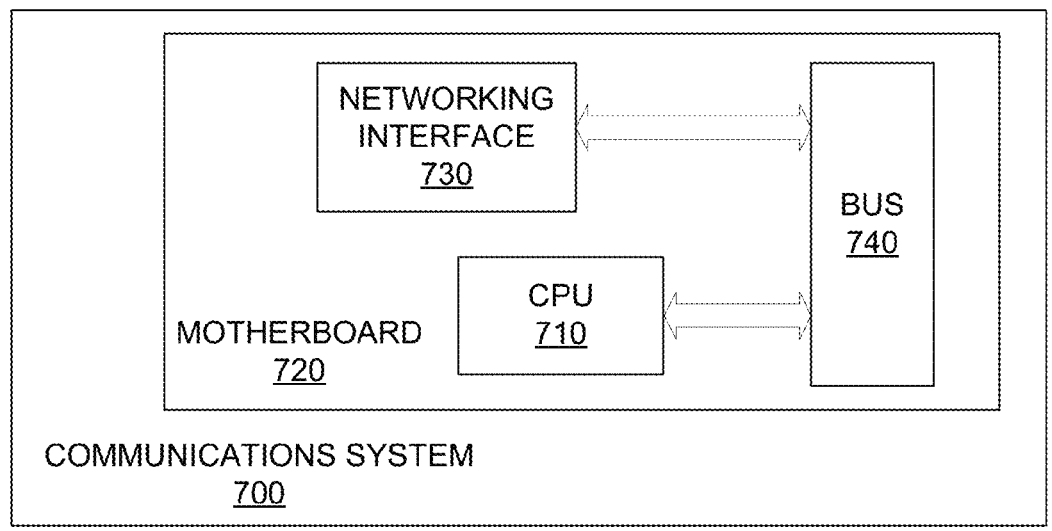
FIG. 7 illustrates a system with a central processing unit comprising modulation doped non-planar transistors.

FIG. 7 illustrates a system with a central processing unit comprising modulation doped non-planar transistors. Here, a communications system 700 for processing data with a central processing unit (CPU) 710 comprising transistors with modulation doped non-planar transistors is illustrated in accordance with one embodiment. The communications system 700 may include a motherboard 720 with the CPU 710, and a networking interface 730 coupled to a bus 740. More specifically, the CPU 710 may comprise the earlier described modulation doped non-planar transistors and/or its method of fabrication. Depending on the applications, the communications system 700 may additionally include other components, including but are not limited to volatile and non-volatile memory, a graphics processor, a digital signal processor, a crypto processor, a chipset, mass storage (such as hard disk, compact disk (CD), digital versatile disk (DVD) and so forth), and so forth. One or more of these components may also include the earlier described graded high germanium content silicon-germanium region and/or its method of fabrication. In various embodiments, communications system 700 may be a personal digital assistant (PDA), a mobile device, a tablet computing device, a laptop computing device, a desktop computing device, a set-top box, an entertainment control unit, a digital camera, a digital video recorder, a CD player, a DVD player, or other digital device of the like.

The foregoing description of the embodiments of the invention has been presented for the purposes of illustration and description. It is not intended to be exhaustive or to limit the invention to the precise forms disclosed. This description and the claims following include terms, such as left, right, top, bottom, over, under, upper, lower, first, second, etc. that are used for descriptive purposes only and are not to be construed as limiting. For example, terms designating relative vertical position refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and still fall within the meaning of the term "top." The term "on" as used herein (including in the claims) does not indicate that a first layer "on" a second layer is directly on and in immediate contact with the second layer unless such is specifically stated; there may be a third layer or other structure between the first layer and the second layer on the first layer. The embodiments of a device or article described herein can be manufactured, used, or shipped in a number of positions and orientations.

Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. A method for forming a non-planar transistor, comprising:
    forming a modulation doped heterostructure comprising:
        forming an active portion having a first bandgap; and
        forming a delta doped portion having a second bandgap, wherein forming the delta doped portion consists of forming a bottom barrier layer, forming a delta doping layer, and forming a spacer layer.

2. The method of claim 1, wherein forming the active portion comprises forming a GaAs active portion and wherein forming the delta doped portion comprises forming an AlGaAs delta doped portion.

3. The method of claim 1, wherein forming the bottom barrier layer comprises forming the bottom barrier layer from a material selected from the group consisting of InAlAs, AlGaAs, AlInSb, and SiGe.

4. The method of claim 1, wherein forming the delta doping layer comprises forming the delta doping layer from a material selected from the group consisting of Si, Be, Te and C.

5. The method of claim 1, wherein forming the spacer layer comprises forming the spacer layer from the same material as the bottom barrier layer.

6. The method of claim 1, wherein forming the active portion comprises forming an active portion having two substantially equal length gates.

7. The method of claim 1, wherein forming the active portion comprises forming an active portion having three substantially equal length gates along at least a portion of the active portion.

8. The method of claim 7, wherein forming the active portion having three substantially equal length gates comprises forming the active portion having three substantially equal length gates of between 20 nm to 40 nm.

9. The method of claim 1, further comprising forming isolation regions positioned directly adjacent the delta doped portion of the modulation doped heterostructure.

10. The method of claim 1, further comprising forming a multi-gate electrode positioned on the modulation doped heterostructure.

11. The method of claim 1, further comprising forming a multi-gate dielectric layer and a workfunction metal layer positioned on the modulation doped heterostructure.

12. A method for forming a non-planar transistor, comprising:
    forming a substrate;
    forming a delta doped large bandgap stack on the substrate;
    forming a multi-gate body comprising forming a narrow bandgap material on the delta doped large bandgap stack; and
    forming isolation regions adjacent to the delta doped large bandgap stack.

13. The method of claim 12, wherein forming the narrow bandgap material comprises forming a InGaAS material and wherein forming the delta doped layer bandgap stack comprises forming an InAlAs material.

14. The method of claim 12, wherein forming the narrow bandgap material comprises forming a GaAS material and wherein forming the delta doped layer bandgap stack comprises forming an InGaAs material.

15. The method of claim 12, wherein forming the delta doped large bandgap stack comprises forming a bottom barrier layer, forming a delta doping layer, and forming a spacer layer.

16. The method of claim 15, wherein forming the delta doping layer comprises forming the delta doping layer from a material selected from the group consisting of Si, Be, Te and C.

17. The method of claim 15, wherein forming the bottom barrier layer comprises forming the bottom barrier layer from a material selected from the group consisting of InAlAs, AlGaAs, AlInSb, and SiGe.

18. The method of claim 15, wherein forming the delta doping layer comprises forming the delta doping layer from a material selected from the group consisting of B, P, As and Sb.

* * * * *